United States Patent [19]
Aoki

[11] 3,978,438
[45] Aug. 31, 1976

[54] TUNING CONTROL APPARATUS
[75] Inventor: Masatsugu Aoki, Soma, Japan
[73] Assignee: Alps Electric Co., Ltd., Tokyo, Japan
[22] Filed: Feb. 25, 1975
[21] Appl. No.: 553,070

[30] Foreign Application Priority Data
Mar. 1, 1974 Japan.............................. 49-24580

[52] U.S. Cl.................................. 334/47; 334/15; 334/86
[51] Int. Cl.² .......................................... H03J 5/00
[58] Field of Search .................. 334/14, 15, 47, 86, 334/87

[56] References Cited
UNITED STATES PATENTS

| | | | |
|---|---|---|---|
| 3,678,421 | 7/1972 | Ono | 334/15 |
| 3,740,679 | 6/1973 | Kimura et al. | 334/87 |
| 3,767,112 | 10/1973 | Tonari | 334/15 |
| 3,769,620 | 10/1973 | Kimura et al. | 334/15 |
| 3,811,100 | 5/1974 | Schmidt | 334/15 |
| 3,824,507 | 7/1974 | Speer et al. | 334/47 |
| 3,828,285 | 8/1974 | Yokoyama et al. | 334/15 |
| 3,878,466 | 4/1975 | Henrickson | 334/15 |

Primary Examiner—Saxfield Chatmon, Jr.
Attorney, Agent, or Firm—Eliot S. Gerber

[57] ABSTRACT

A frequency band selection switch and variable resistor assembly for one channel of a television tuner in which tuning is performed by varying a tuning voltage. A tuning shaft is connected to the slider of the variable resistor through a harmonic drive reduction gear assembly. A tuning scale is connected to the slider through a bored tuning scale shaft through which the tuning shaft coaxially extends. A bored switch shaft through which both the tuning and tuning scale shafts coaxially extend carries a movable contact of the band selection switch and a frequency band indicator. An assembly support member has a graduated dial associated with both the tuning scale and the frequency band indicator in a unitary manner.

3 Claims, 8 Drawing Figures

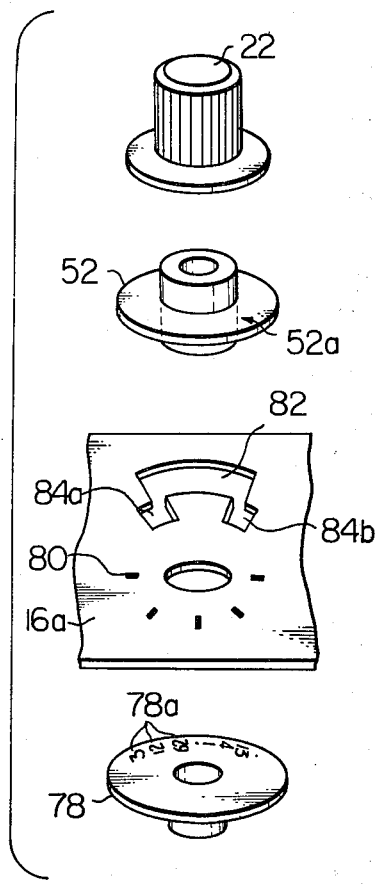
Fig. 3
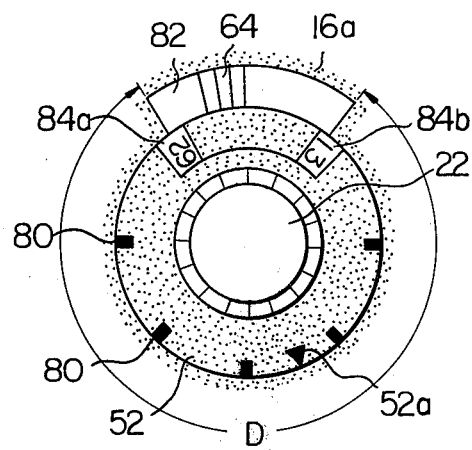
Fig. 4
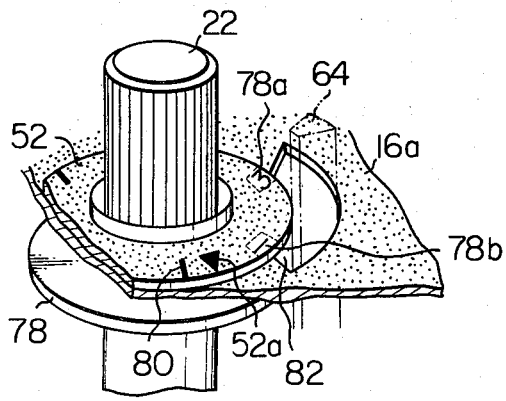
Fig. 5
Fig. 6

TUNING CONTROL APPARATUS

The present invention relates to a frequency band selection switch and variable resistor assembly for one channel of a television tuner in which tuning is performed by varying a tuning voltage.

The introduction of variable capacitance diodes (varactors) has made possible electronic tuners for television sets and the like in which tuning is performed by varying a tuning voltage. This, in turn, has contributed to the development of solid state television tuners featuring push button, touch channel, rotary channel and remote control channel switching, as opposed to the convention barrel or turret switch. Such tuners comprise a channel selection switch assembly and solid state tuning and local oscillator circuits utilizing varactors. Due to the configuration of the tuning and local oscillator circuits, a frequency band selection switch and a variable resistor are associated with each channel for which push button type selection is to be provided. The frequency band switches are properly set for the various channels and the variable resistors are adjusted to obtain optimum electrical resonance. The procedure is required only once, and after that the channels may be push button selected without the need for fine tuning.

In prior art television tuning systems of this type, the channel selection switch, band selection switch and variable resistor assemblies are frequently combined into an integral unit. This results in a complicated apparatus which is difficult and expensive to manufacture. A further drawback is encountered in model changing when it is desired to modify or change the channel selection switch assembly since the entire apparatus must be redesigned. In order to overcome this drawback, prior art television tuning systems of this type may provide the channel selection switch, band selection switch and variable resistor assemblies completely separate from each other and mounted on different frames. This, however, complicates the wiring arrangement and introduces confusion into the tuning procedure since a band selection switch and a variable resistor which are located in different places in the television set must be correctly associated with each other and adjusted to provide optimum tuning of each channel.

The present invention is based on the observation that the same band selection switches and variable resistors may be used with a wide variety of different types of channel selection switches, and that if the band selection switch and variable resistor for a given channel are combined into an integral and standardized unit, the manufacturing process may be significantly rationalized and the tuning process simplified.

It is therefore an object of the present invention to provide an integral frequency band selection switch and tuning element assembly for one channel of a voltage controlled television tuner.

It is another object of the present invention to provide an tuning control apparatus for a television tuner which provides clear tuning indication and simplifies the tuning process.

It is another object of the present invention to provide standardized tuning control apparatus which may be utilized with a variety of channel selection switch assemblies.

It is another object of the present invention to provide tuning control apparatus especially suited to a remote control channel selection system and featuring a provision for skipping a channel.

The above and other objects, features and advantages of the present invention will become apparent from the following detailed description taken with the accompanying drawings, in which:

FIG. 3 is an exploded view of another part of the apparatus shown in FIG. 1;

FIG. 4 is a top view of a dial assembly shown in FIG. 1;

FIG. 5 is an exploded view of the dial assembly shown in FIG. 4;

FIG. 6 is a view of a frequency band indicator shown in FIG. 3;

Figure 1:
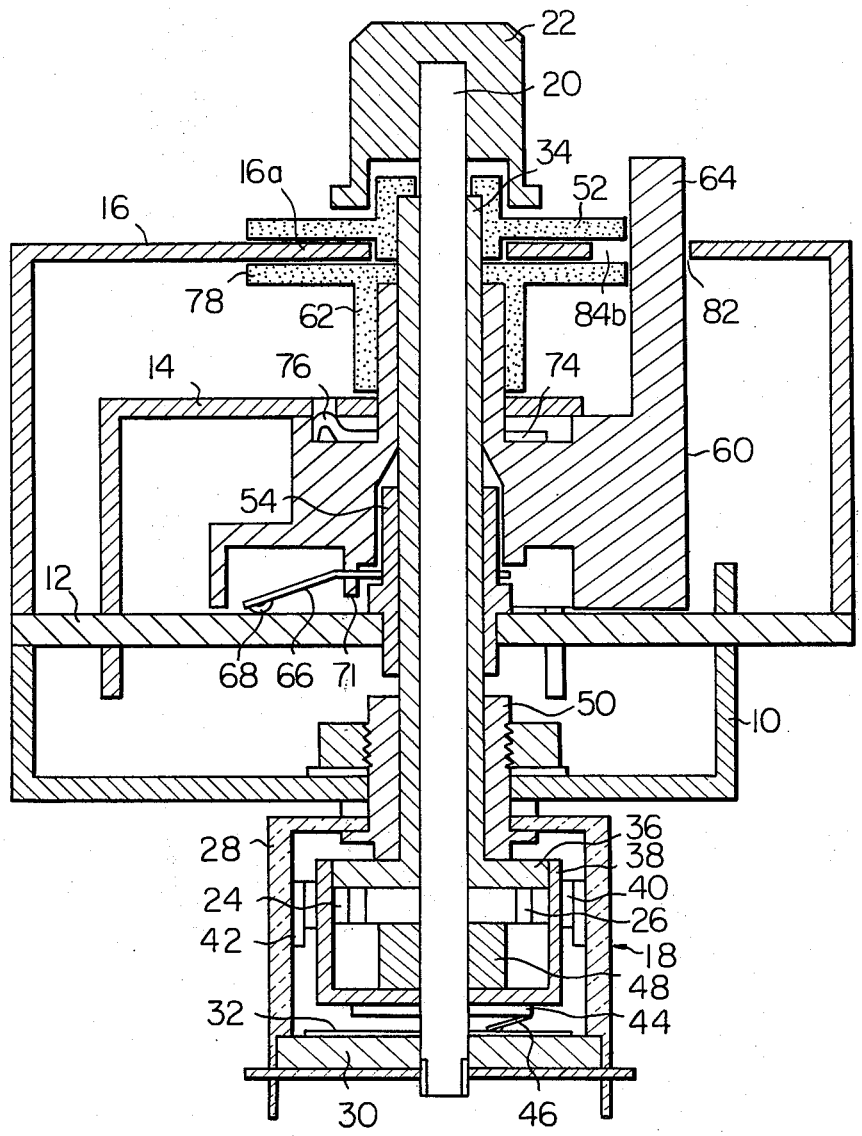
FIG. 1 is a sectional view of tuning control apparatus embodying the present invention.
Figure 2:
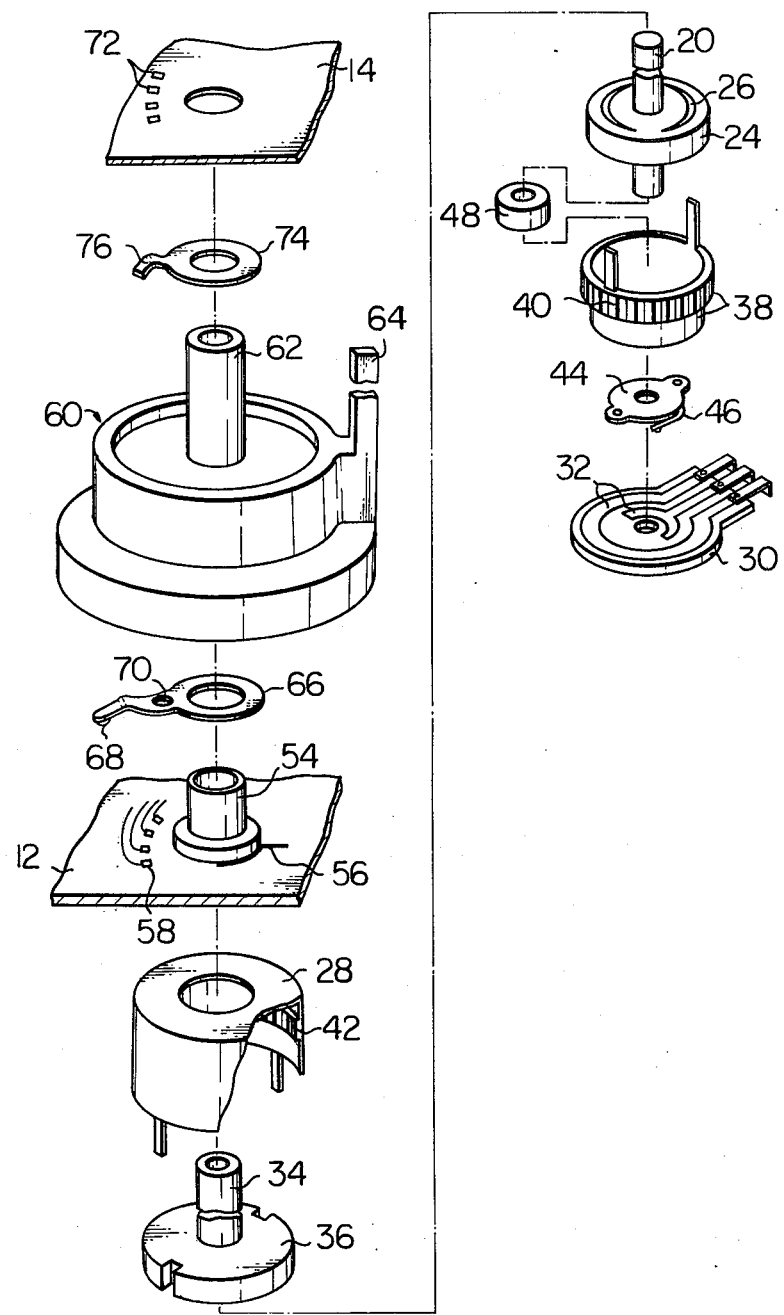
FIG. 2 is an exploded view of part of the apparatus shown in FIG. 1.

Referring now to FIG. 1, a support member 10 is fixed to a television set (not shown), and support members 12, 14 and 16 are fixed to the support member 10. A tuning element shown as a variable resistor 18 is fixed to the support member 10. A tuning shaft 20 has a handle or knob 22 fixed to its upper end and extends through the support members 16, 14, 12 and 10 and the variable resistor 18. A resilient pressure member 24 integral with the tuning shaft 20 is formed in the shape of an oval with crescent shaped cutouts 26 formed in the major lobes of the oval. Referring also to FIGS. 2 and 3, the variable resistor 18 has a cup shaped body 28 fixed to the support member 10 and a base 30 fixed to the body 28. Resistance elements 32 are fixed to the base 30. A non-conductive tuning scale shaft 34 is formed with a bore (no numeral) and a disc portion 36 made of, for example, synthetic resin by injection molding or die casting. A cup shaped member 38 is made of a flexible material, has an external gear 40 formed integrally therewith and associated with an internal gear 42 integral with the inner surface of the body 28. The cup shaped member 38 is fixed to the disc portion 36 of the tuning scale shaft 34, and a slider retainer 44 is fixed to the bottom of the cup shaped member 38 and maintains a slider 46 in contact with the resistance elements 32. A spacer 48 is inserted between the pressure member 24 and the bottom of the cup shaped member 38. The external gear 40 has slightly fewer teeth than the internal gear 42, and the major lobes of the oval pressure member 24 press diametrically opposed portions of the external gear 40 into engagement with the internal gear 42 by elastically deforming the teeth of the external gear 40. The pressure member 24, external gear 40 and internal gear 42 constitute a harmonic drive reduction gear mechanism.

A bearing 50 fixed to the support member 10 rotatably supports the tuning and tuning scale shafts 20 and 34 respectively, and a transparent dial or tuning scale 52 is fixed to the upper end of the tuning scale shaft 34. A conductive bearing 54 is fixed to the support member 12 and assists in rotatably supporting the shafts 20 and 34.

The support member 12 has printed thereon electrical contacts 56 and 58, the conductive bearing 54 being maintained in ohmic engagement with the contact 56. A switch actuating member 60 is integrally formed with a bored switch shaft 62 by which it is coaxially rotatably fitted on the tuning scale shaft 34. A handle 64 is integrally formed with the actuating member 60. A movable contact 66 is ohmically rotatably fitted on the bearing 54 and has a contact portion 68 engagable with the contacts 58. The contact 66 is integrally rotatable with the actuating member 60 by means of a lug 71 on the bottom of the actuating member 60 extending through a hole 70 in the contact 66. A detent assembly is constituted by a resilient detent member 74 rotatable with the shaft 62 having a projection 76 resiliently engagable in holes 72 formed in the support member 14. The arrangement is such that the contact 66 engages with a contact 58 when the projection 76 is in a respective hole 72 in a well known manner. A frequency band or switch position indicator 78 is fixed to the upper end of the shaft 62 and has the same diameter as the scale 52.

Figure 7:
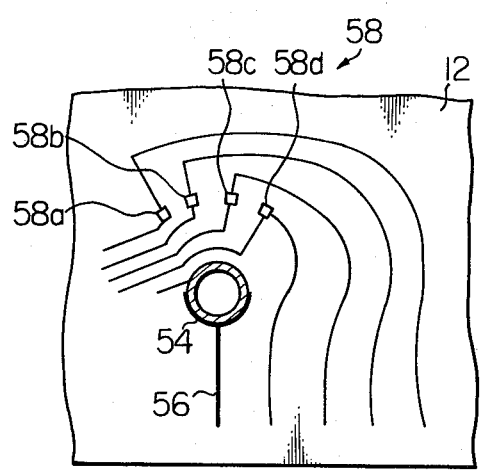
FIG. 7 is a fragmentary view of a frequency band switch shown in FIG. 1.

As best seen in FIG. 3, the upper portion of the support member 16 is formed as a dial 16a having indications or graduations 80 printed thereon. An arcuate slot 82 is formed through the dial 16a through which the handle 64 of the switch actuating member 60 extends. Windows 84a and 84b are formed in the dial 16a at the ends of the slot 82. The frequency band indicator 78 has numeral and symbol marks 78a printed thereon. Referring also to FIG. 7, four contacts 58 are provided and designated as 58a, 58b, 58c and 58d.

As clearly shown in FIG. 3, the tuning scale 52 is formed with a mark 52a and is disposed above the dial 16a. The indicator 78 is disposed below the dial 16a so that the marks 78a are visible through the windows 84a and 84b and scale 52.

As mentioned above, a unit as shown in FIG. 1 is provided for each channel to be selected by push button or remote control channel switching. Preferably, twelve units are provided for the twelve VHF channels respectively. Since in most locations all of the VHF channels are not in service, it is desirable when utilizing remote control channel switching to provide means for skipping unused channels. If UHF is also provided, one or more of the units may be used to select one or a plurality of UHF channels.

In voltage controlled television tuners currently in use, the tuning range of channels 1 to 62 is divided into three bands: 1 to 3, 4 to 12 and 13 to 62. The switch contacts 56 and 58 are connected to the tuner and channel switch assembly in a known manner (not shown) to provide band switching for the respective channel. The variable resistor 18 is also connected to the channel switch assembly and tuner to adjust the tuning voltage to provide optimum resonance for the respective channel.

As shown in FIG. 7, the contact 58a is used in remote control channel selection to provide a skipping function (skipping the respective channel) and is suitably connected to the tuner.

In operation, when it is desired to skip the respective channel, the handle 64 is rotated to its maximum counterclockwise position as viewed in FIGS. 4 and 7 and the member 60, shaft 62, movable contact 66 and indicator 78 rotate as a unit so that the movable contact 66 is held in engagement with the skipping contact 58a by the detent mechanism and dots printed on the indicator 78 constituting part of the parks 78a are visible through the windows 84a and 84b respectively. An electrical connection is made between the contacts 56 and 58a through the conductive bearing 54 and the movable contact 66 so that the remote control channel selection assembly will skip the respective channel.

To set the apparatus to one of channels 13 to 62, the switch actuating member 60 is rotated clockwise to the position shown in FIG. 4 in which the movable contact 66 engages with the contact 58b and the numerals 62 and 13 are visible through the windows 84a and 84b respectively indicating the frequency band of channels 13 to 62. The knob 22 is then rotated so that the tuning shaft 20 and pressure member 24 rotate therewith as a unit. The teeth of the external gear 40 are resiliently deformed so that the external gear 40 and the cup shaped member 38 are caused to rotate at a reduced speed determined by the difference in the numbers of teeth of the external and internal gears 40 and 42 respectively. The slider 46 attached to the bottom of the cup shaped member 38 rotates therewith in contact with the resistance elements 32 to vary the tuning voltage applied to the tuner. The tuning scale shaft 34 and tuning scale 52 rotate with the cup shaped member 38 in a unitary manner. The slider 46 and tuning scale 52 are rotatable within a range indicated by an arrow D in FIG. 4 which is determined by limit stops (not shown). The graduations or marks 80 are visible through the tuning scale 52, and the position of the mark 52a on the tuning scale 52 relative to the graduations 80 provides a tuning indication.

The knob 22 is rotated until optimum resonance or tuning is determined either visually by looking at the television screen or electronically by means of a test instrument (not shown) connected to the television set.

To tune one of channels 4 to 12, the actuator member 60 is rotated further clockwise as viewed in FIG. 4 so that the contact 66 engages with the contact 58c and the numerals 12 and 4 are visible through the windows 84a and 84b respectively. Further clockwise rotation of the actuating member 60 will cause the contact 66 to engage with the contact 58d and the numerals 3 and 1 to be visible through the windows 84a and 84b respectively.

Figure 8:
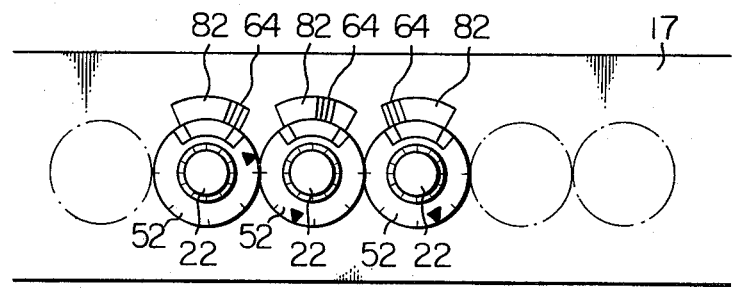
FIG. 8 is a view of the dials of a plurality of the apparatus shown in FIG. 1 grouped together.

FIG. 8 shows a plurality of band selection switch and variable resistor units arranged in a row. It is entirely within the scope of the present invention to provide integral support members providing the function of the support members 10, 12, 14 and 16 for a plurality of units, rather than separate support members for individual units. As shown in FIG. 8, a single support member 17 replaces the support members 16 for six units.

The embodiment of the present invention shown is exemplary only. Although only one rotary switch comprising the contacts 56, 58 and 66 is shown, a plurality of such switches may be ganged together. The contacts of a plurality of switches may printed on the support member 12 is desired.

The tuning element is shown and described as a variable resistor 18. The variable resistor 18 may be replaced by another tuning element such as a variable capacitor or inductor if desired. The harmonic drive reduction gear mechanism may be replaced by a planetary or other gear mechanism for fine tuning or omitted. The base member 30 and support member 12 may be integral.

From the above disclosure it will be clear that an integral tuning element and band switching unit according to the present invention provides a clear indication of both the frequency band and the tuning element position, and facilitates tuning since the two tuning means required are provided together. Such a unit may be utilized with many different types of channel switching assemblies, and is not subject to model changes. The provision of the contact 58a enables channel skipping when the unit is used with a remote control or similar channel switching apparatus. By suitable selection of the reduction gear mechanism, the rotational range of the slider 46 and tuning scale 52 can be set to any convenient value to be compatible with the rotational range of the switch actuating member 60. Various other modifications and features will be apparent to one skilled in the art.

What is claimed is:

1. A tuning control apparatus, comprising:
   a rotatably variable tuning element having a fixed part and a movable part operatively associated with said fixed part;
   a tuning scale;
   a rotatable tuning shaft, said movable part and said tuning scale being connected to said tuning shaft for rotation;
   a rotary switch having a fixed contact and a movable contact operatively associated with said fixed contact;
   a switch position indicator;
   a rotatable switch shaft, said movable contact and said switch position indicator being connected to said rotatable switch shaft;
   said switch shaft being formed with a bore and said tuning shaft extending through said bore; and
   a fixed support member having position indications, both said tuning scale and said switch position indicator being rotatably associated with the position indications on said fixed member.

2. The apparatus of claim 1 in which the movable part of said tuning element and said tuning scale are fixed together for unitary rotation, and which further comprises gear means connecting the tuning shaft to said tuning element.

3. The apparatus of claim 2, in which the gear means is a harmonic drive mechanism.

* * * * *